United States Patent
Kawakami

(10) Patent No.: US 7,830,284 B2
(45) Date of Patent: Nov. 9, 2010

(54) ENTROPY ENCODING APPARATUS, ENTROPY ENCODING METHOD, AND COMPUTER PROGRAM

(75) Inventor: Masashi Kawakami, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 12/207,084

(22) Filed: Sep. 9, 2008

(65) Prior Publication Data

US 2009/0079601 A1   Mar. 26, 2009

(30) Foreign Application Priority Data

Sep. 26, 2007   (JP)   ............................. 2007-250066

(51) Int. Cl.
*H03M 7/30*   (2006.01)
(52) U.S. Cl. .................. 341/107; 375/240.23
(58) Field of Classification Search ................ 341/107; 382/247; 375/240.23, 240.24
See application file for complete search history.

(56) References Cited

U.S. PATENT DOCUMENTS

| | | | |
|---|---|---|---|
| 6,864,813 B2* | 3/2005 | Horie | 341/107 |
| 7,365,659 B1* | 4/2008 | Hoffmann et al. | 341/107 |
| 2005/0249289 A1 | 11/2005 | Yagasaki et al. | |
| 2007/0194953 A1* | 8/2007 | Cho | 341/50 |
| 2008/0240233 A1* | 10/2008 | Au et al. | 375/240.02 |
| 2009/0304075 A1* | 12/2009 | Ogura et al. | 375/240.12 |

FOREIGN PATENT DOCUMENTS

JP   2004-135251   4/2004

* cited by examiner

*Primary Examiner*—Howard Williams
(74) *Attorney, Agent, or Firm*—Cowan, Liebowitz & Latman, P.C.

(57) ABSTRACT

An entropy encoding apparatus comprises: a binarization unit configured to convert an input syntax element into binarized data; a context calculation unit configured to generate a context index; a context memory unit configured to hold context information; and an arithmetic coding unit configured to perform arithmetic coding using context information output corresponding to the generated context index, and the binarized data, is provided. The context memory unit comprises: a storage unit, an initial value generation unit configured to generate an initial value of context information, a control unit configured to output a control signal specifying which to select between the initial value and the context information which corresponds to the generated context index, a selection unit configured to select either of the initial value or the context information which corresponds to the generated context index, an updating unit configured to generate updated context information.

7 Claims, 7 Drawing Sheets

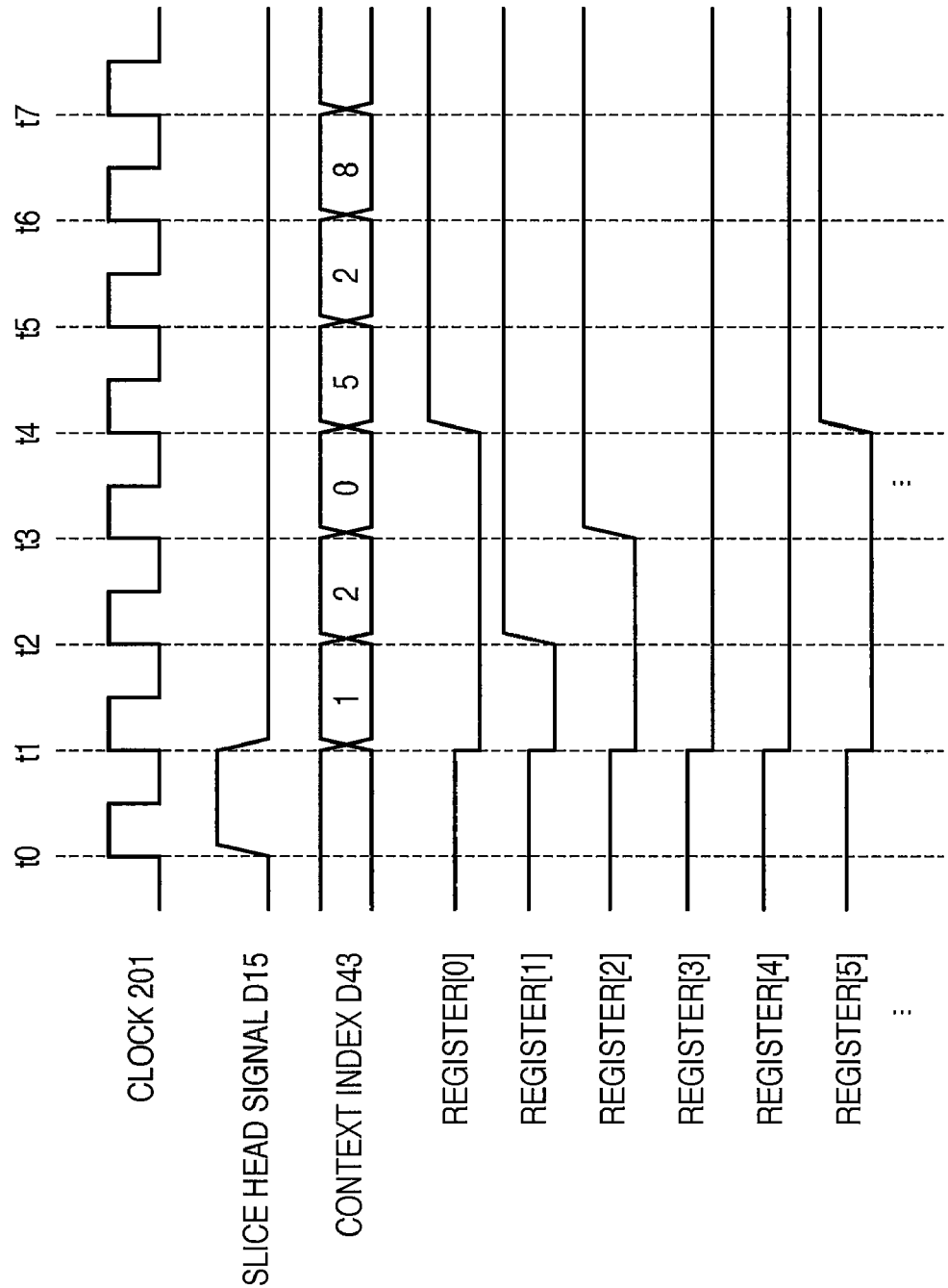

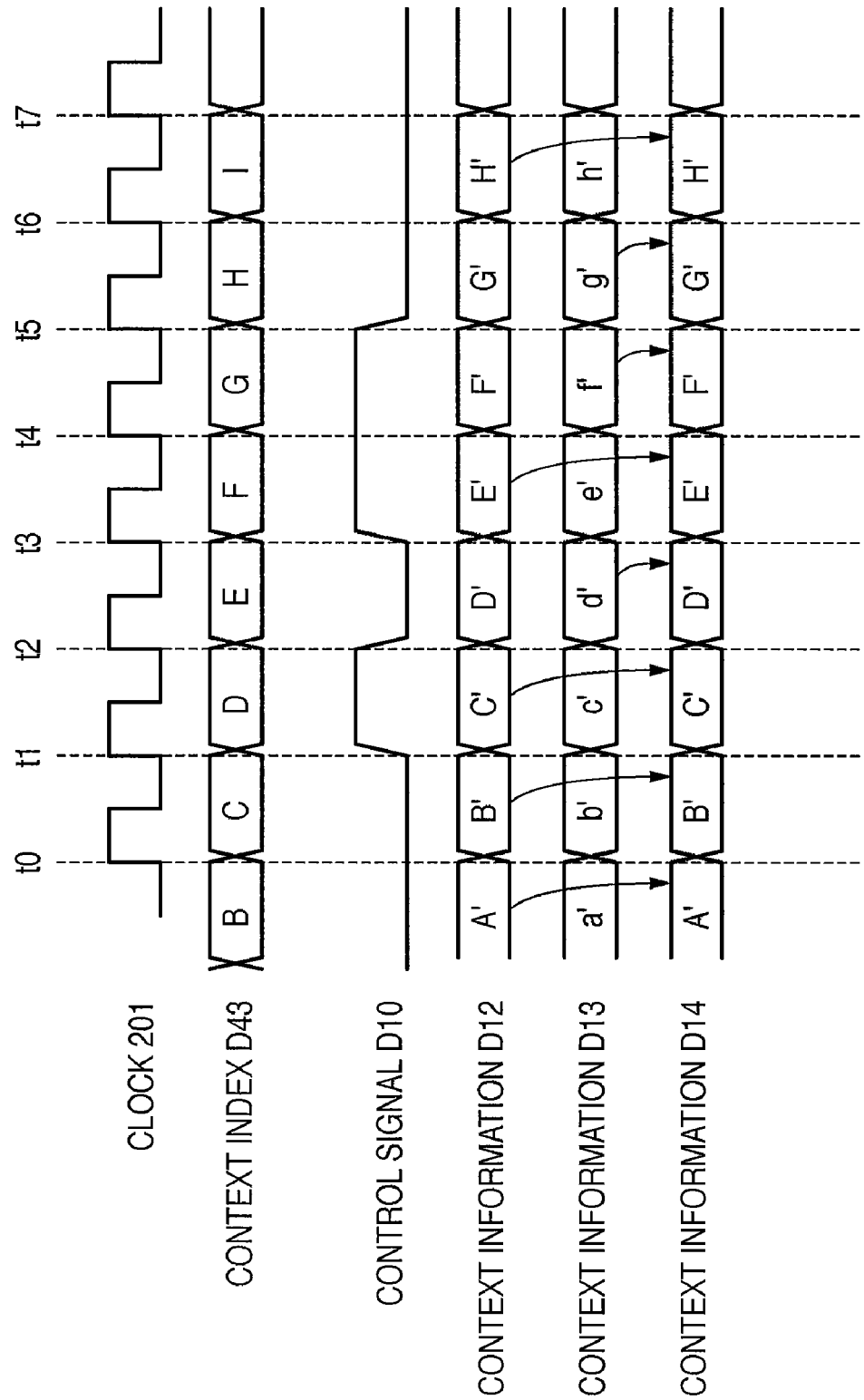

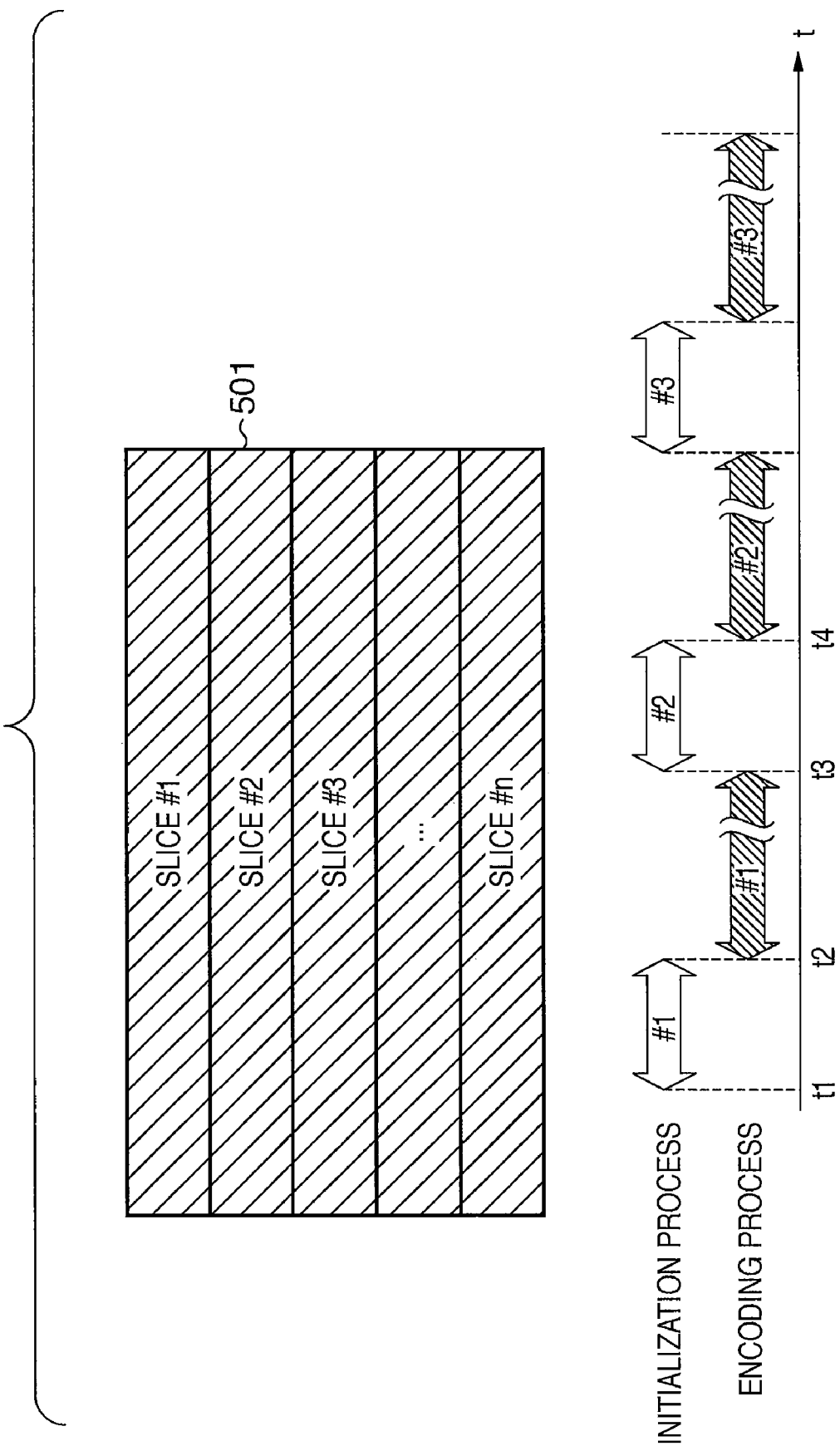

ENTROPY ENCODING APPARATUS, ENTROPY ENCODING METHOD, AND COMPUTER PROGRAM

BACKGROUND OF THE INVENTION

1. Field of the Invention

The present invention relates to an entropy encoding apparatus, entropy encoding method, and computer program.

2. Description of the Related Art

Recent advances in digital signal processing and increases in LSI circuit density and speed have enabled high-efficiency encoding of a large volume of digital information such as moving images, still images, and voice, allowing them to be recorded on recording media and transmitted via communications media. A moving image encoding apparatus which can convert video images of TV broadcasting or a digital video camera into a stream is being developed using such technology.

As a standard for moving image encoding, H.264 (AVC) worked out by the ITU-T has been attracting attention in recent years. H.264 implements higher-efficiency encoding than MPEG which is a conventional standard for moving image encoding. The factors which have enabled H.264 to implement high-efficiency encoding include entropy encoding. In particular, as a method for implementing high-efficiency entropy encoding, H.264 adopts an entropy coding using arithmetic coding known as CABAC (Context Adaptive Binary Arithmetic Coding). CABAC is described in Japanese Patent Laid-Open No. 2004-135251.

Main components of CABAC as an entropy encoding unit adopted by H.264 are shown in FIG. 4. Syntax elements which serve as input data to the entropy encoding unit 400 include motion vector information, transform coefficients, quantization parameter, and the like, each of which is a multi-valued signal. CABAC mainly consists of the following four units.

A first unit is a binarization unit 401 which binarizes syntax elements—which are multi-valued input data—using a binarizing method defined for each type of syntax element and outputs binarized data D42. The binarization unit 401 also outputs information D41 needed to generate a context index to a context calculation unit 402. The context index and the context calculation are described later.

A second unit is the context calculation unit 402 which outputs a context index D43 defining context information for each bit of binarized data D42. The context information includes most probable symbol and probability state index and is a signal used by a binary arithmetic coding unit 404. The binary arithmetic coding unit 404 is described later. The most probable symbol is a value of a symbol which, being defined for each bit of the binarized data D42 output from the binarization unit 401, has a statistically high event probability. The probability state index is the data which indirectly represents the event probability of the symbol value.

In CABAC, context information is updated during encoding based on results of the encoding and thereby context information suitable for input data is constructed in the process of encoding. Using context information which behaves in this way, CABAC coding implements high-efficiency encoding.

Also, ITU-T Recommendation H.264 indirectly defines initial values for 460 types of context information. The 460 types of context information are managed by the context index D43. The context index D43 takes a value from 0 to 459 (both inclusive) and each value of the context index D43 corresponds to one piece of context information.

Returning to FIG. 4, a third unit is a context memory unit 403 which holds the context information. The context memory unit 403 is a storage unit which holds context information for each context index D43 generated by the context calculation unit 402. The context memory unit 403 outputs the context information D44 to the binary arithmetic coding unit 404.

A fourth unit is the binary arithmetic coding unit 404 which performs arithmetic coding using the context information D44 and binarized data D42.

According to ITU-T Recommendation H.264, CABAC prescribes that the context information should be initialized each time a new slice is encoded. That is, when the head of a slice is detected during CABAC-based encoding, the context information held in the context memory unit 403 is initialized. The initialization process is followed by an encoding process.

A temporal relationship between the initialization process and encoding will be described with reference to FIG. 5. A frame 501 shown at the top of FIG. 5 shows one of the frames which is divided into n slices. A graph at the bottom of FIG. 5 shows processing time of initialization processes and processing time of the CABAC encoding along a time axis represented by the abscissa.

When the head of slice #1 is detected at time t1, an initialization process of slice #1 is started at time t1 and 460 types of context information are initialized. The initialization process of context information in slice #1 is ended at time t2 and then an encoding process is started using the initialized context information. At time t3, if the head of slice #2 is detected, an initialization process of context information in slice #2 is started in a similar manner. The initialization process of the context information in slice #2 is ended at time t4 and then an encoding process is started using the initialized context information.

Since there are 460 types of context information, the initialization process described above requires a correspondingly large amount of processing time. Also, in a case where one frame is configured by a plurality of slices, the initialization process of the context information is performed for the number of the slices. Thus, conventional techniques have a problem in that much processing time is required due to the large amounts of computation required to generate the initial values of context information.

The present invention provides a technique for reducing processing cycles required to initialize context information, thereby speeding up initialization of the context information.

SUMMARY OF THE INVENTION

According to one aspect of the present invention, an entropy encoding apparatus comprises: a binarization unit configured to convert an input syntax element into binarized data; a context calculation unit configured to generate a context index used to identify context information for each bit of the binarized data; a context memory unit configured to hold context information; and an arithmetic coding unit configured to perform arithmetic coding using context information output from the context memory unit corresponding to the generated context index, and the binarized data, wherein the context memory unit comprises: a storage unit, an initial value generation unit configured to generate an initial value of context information based on the generated context index, a control unit configured to output a control signal specifying which to select between the initial value and the context information which, being held in the storage unit, corresponds to the generated context index, a selection unit configured to select either of the initial value or the context information which corresponds to the generated context index, based on the control signal, an updating unit configured to generate updated context information based on a comparison between an output produced by the selection unit and the binarized data, and the storage unit holds the updated context information generated by the updating unit, associating with the generated context index.

Further features of the present invention will become apparent from the following description of exemplary embodiments (with reference to the attached drawings).

BRIEF DESCRIPTION OF THE DRAWINGS

FIG. 2A is a timing chart showing an example of a process in a control unit 105 according to the embodiment of the present invention;

FIG. 3A is a timing chart showing an example of a process in a selection unit 103 according to the embodiment of the present invention;

FIG. 5 is a diagram illustrating a relationship between processing time for initialization and processing time for encoding in an entropy encoding process.

DESCRIPTION OF THE EMBODIMENTS

An embodiment of the present invention will be described below with reference to the accompanying drawings.

Figure 4:
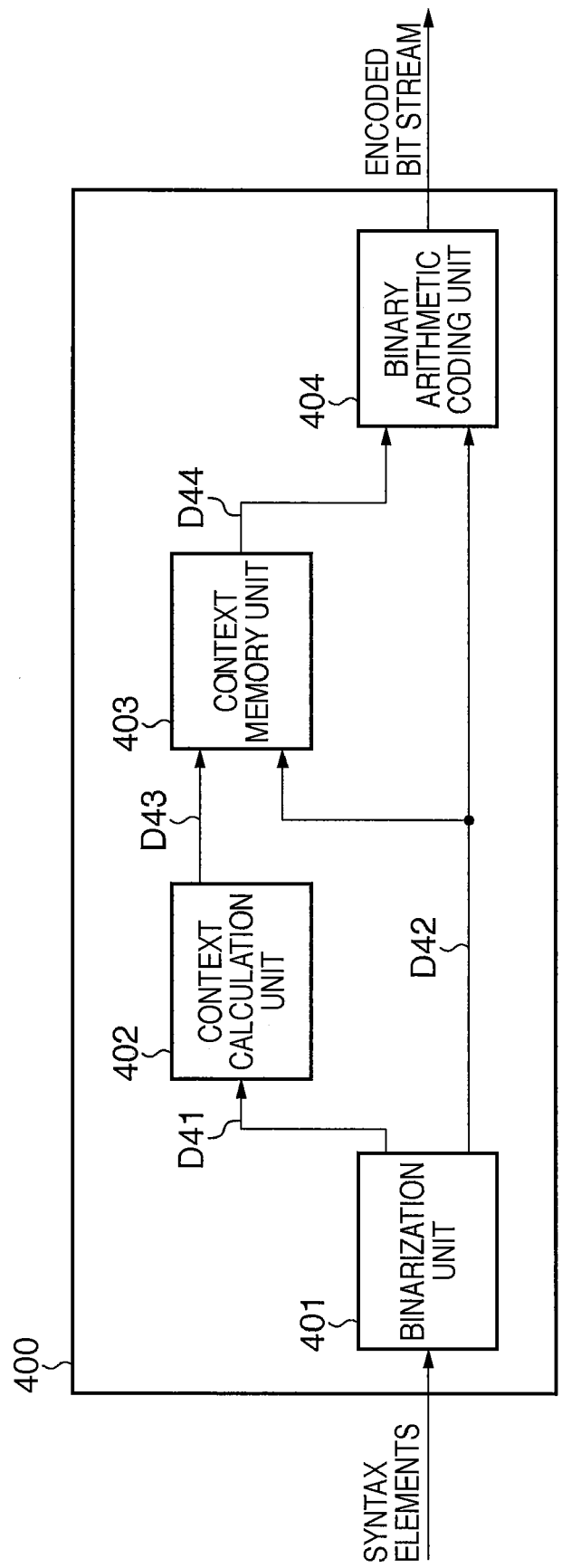
FIG. 4 is a block diagram showing a configuration of an entropy encoding unit.

An entropy encoding apparatus according to the present embodiment includes a binarization unit 401, context calculation unit 402, and binary arithmetic coding unit 404 out of the components shown in the block diagram of FIG. 4. The binarization unit 401 converts syntax elements—which are multi-valued input data—into binarized data using a binarizing method defined for each type of syntax element. The binarization unit 401 outputs information D41 needed to generate a context index to the context calculation unit 402. The context index and the context calculation unit 402 are described later. The context calculation unit 402 also outputs a context index D43 defining context information for each bit of the binarized data D42. Furthermore the binary arithmetic coding unit 404 performs binary arithmetic coding using input context information which is D11 described later and the binarized data D42.

Figure 1:
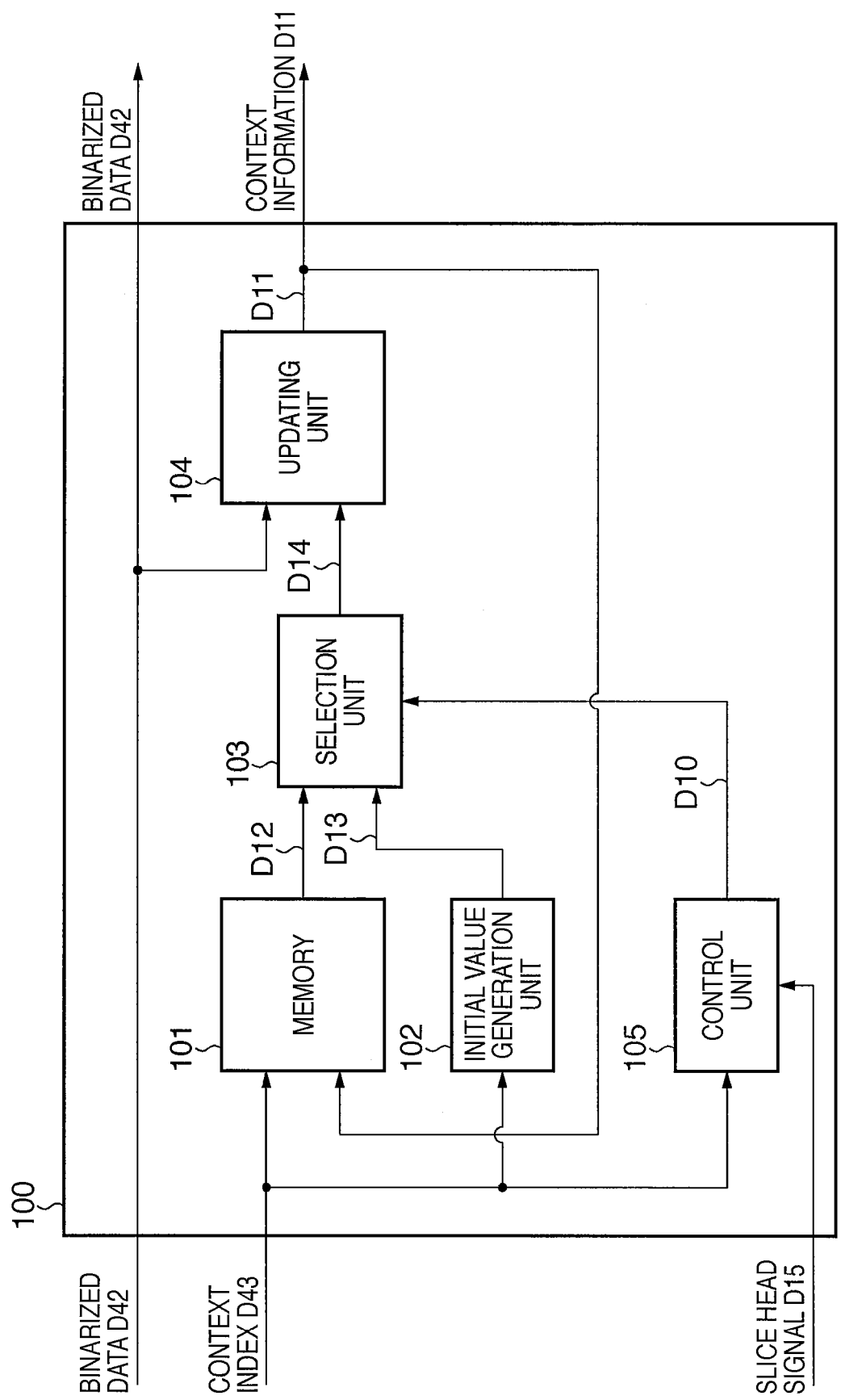
FIG. 1 is a block diagram showing an exemplary configuration of a context memory unit according to an embodiment of the present invention.

The entropy encoding apparatus according to the present embodiment is equipped with a context memory unit 100 instead of the context memory unit 403 shown in FIG. 4. FIG. 1 is a block diagram showing the context memory unit 100 according to the present embodiment. The context memory unit 100 in FIG. 1 is placed between the context calculation unit 402 and binary arithmetic coding unit 404, in the entropy encoding unit 400 in FIG. 4.

The context memory unit 100 accepts inputs of 1-bit binarized data D42 to be encoded, the context index D43 assigned to each item of binarized data, and a slice head signal D15 which indicates that the head of a slice has been input. The slice head signal D15 may be generated in relation to an incoming syntax element by the binarization unit 401 or an analyzing unit (not shown) which analyzes syntax elements.

The context memory unit 100 according to the present embodiment has, for example, the following elements.

A memory 101 holds context information. The context index D43 from the context calculation unit 402 is input as a write-address in the memory 101 and stored therein, being associated with updated context information D11 which is output by an updating unit 104. Also, context information D12 stored in the memory 101 is output to a selection unit 103 using the context index D43 as a read-address.

The context information D12 includes most probable symbol (symbols which have statistically high event probabilities) and probability state index (data which indirectly represents the event probabilities of the symbols with statistically high event probabilities).

An initial value generation unit 102 generates an initial value of the context information D13 corresponding to the input context index D43 and outputs the initial value of the context information D13 to the selection unit 103. The selection unit 103 accepts inputs of the context information D12 from the memory 101 and the initial value of the context information D13 from the initial value generation unit 102, selects one of the inputs according to a control signal D10 from a control unit 105, and outputs the selected input to the updating unit 104 as context information D14.

The updating unit 104 accepts inputs of the binarized data D42 and the context information D14 provided by the selection unit 103 as a result of selection, and compares the value of the binarized data D42 and the value of most probable symbol-contained in the context information D14. When the comparison shows that the two values are equal, the updating unit 104 outputs the input context information D14 as context information D11 without updating. When the two values are not equal, the updating unit 104 updates the probability state index contained in the context information D14 according to a predetermined specific table and outputs the updated context information D14 as context information D11. The output from the updating unit 104 is output to both the memory 101 and the binary arithmetic coding unit 404.

The control unit 105 accepts inputs of the slice head signal D15 and context index D43, where the slice head signal D15 is a flag signal which goes "High" when a slice head is input in the entropy encoding unit 400. Upon detecting the "High" state of the slice head signal D15, the control unit 105 determines whether the given type of context index D43 is input for the first time since the "High" state was detected.

To determine whether a given type of context index is input for the first time since the "High" state of the slice head signal D15 was detected, according to the present embodiment, the control unit 105 has a register. Since ITU-T Recommendation H.264 prescribe that the context index takes a value (type) from 0 to 459 (both inclusive), the control unit 105 has a 460-bit register which is the number of bits corresponding to the number of types.

As will be described in detail with reference to FIGS. 2A, 2B, 3A, and 3B, the use of the register allows the control unit 105 to determine whether or not the context information corresponding to the input context index D43 has been initialized. If it is determined that the context information has been initialized, the control unit 105 outputs a control signal D10 to the selection unit 103 instructing to select the context information D12 from the memory.101. If it is determined that the context information has not been initialized, the control unit 105 outputs a control signal D10 to the selection unit 103 for instructing to select the initial value of the context information D13 from the initial value generation unit 102.

Figure 2B:
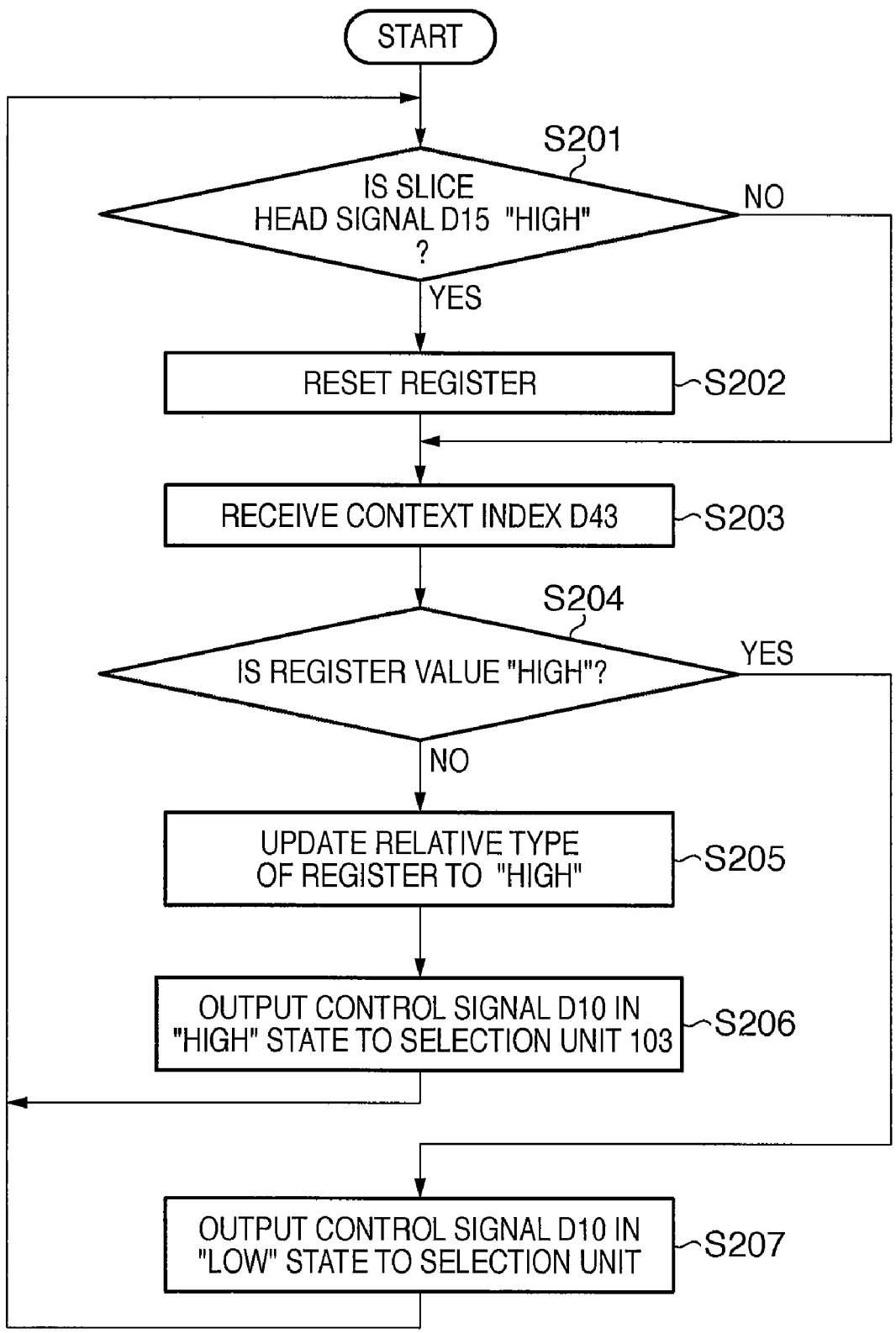
FIG. 2B is a flowchart showing an example of a process performed by the control unit 105 according to the embodiment of the present invention.

Next, a flow of an initialization process in the memory 101 will be described with reference to FIGS. 2A and 2B. FIG. 2A is a timing chart showing an example of a process in the control unit 105. FIG. 2B is a flowchart showing an example of a process performed by the control unit 105.

A clock 201 in FIG. 2A shows an operation clock used by the context memory unit 100. The slice head signal D15 is a flag signal which goes "High" when data input in the entropy encoding unit 400 is a slice head. To obtain the slice head signal D15 allows the context memory unit 100 to determine whether or not the input context index D43 corresponds to the slice head. For example, the slice head signal D15 goes "High" at time t0 shown in FIG. 2A, meaning that the data input timing t1 is the head of a slice.

The context index D43 is input in the context memory unit 100. The context index input at time t1 corresponds to the context index at the slice head.

Register[0], register[1], register[2], register[3], register[4], and register[5] represent one of the bit positions of the 460-bit register respectively. For example, register[0] represents the 0-th bit of the 460-bit register. Alternatively, register[0] may represent the 459-th bit, of course.

Operations in the control unit 105 will be described in more detail below with additional reference to the flowchart in FIG. 2B.

Upon receiving the slice head signal D15, the control unit 105 determines in Step S201 whether or not the slice head signal D15 is "High". At time t0 in FIG. 2A, the slice head signal D15 goes "High" ("YES" in Step S201). In this case, the control unit 105 goes to Step S202 to reset each bit of the 460-bit register to "Low". On the other hand, if the slice head signal D15 is "Low" ("NO" in Step S201), the control unit 105 goes to Step S203.

In Step S203, the control unit 105 receives the context index D43. At time t1 in FIG. 2A, a value "1" of the context index is input. In following Step S204, the control unit 105 determines whether or not the register value at the bit position which corresponds to the value of the received context index is "High".

If the register value is "Low" ("NO" in Step S204), the control unit 105 can determine that the given type of context index is input for the first time since input of slice head data. The given context index corresponds to context information which needs to be initialized. Consequently, the control unit 105 goes to Step S205 to assert the register value at the bit position which corresponds to the value of the received context index D43 "High".

For example, at time t1, since the value of the context index D43 shows "1," register[1] which corresponds to the first bit of the 460-bit register is asserted "High" by the control unit 105. Similarly, at time t2, since the value of the context index D43 is "2," register[2] which corresponds to the second bit of the 460-bit register is asserted "High" by the control unit 105. In the following Step S206, the control unit 105 outputs a control signal D10 in "High" state to the selection unit 103.

In Step S204, if the register value is "High" ("YES" in Step S204), the control unit 105 can determine that the given type of context index has already been input since the input of slice head data. The given context index corresponds to context information which does not need to be initialized. For example, the value of the context index D43 "2" is input at time t5 which is the same value as at time t2. However, register[2] was already asserted "High" at time t3. Therefore, at time t5, there is no bit value change to the 460-bit register. Thus, the control unit 105 goes to Step S207 to output a control signal D10 in "Low" state to the selection unit 103. Consequently, the selection unit 103 selects the context information D12 output from the memory 101.

After completion of process in Step S206 or Step S207, the control unit 105 returns to Step S201 and keeps updating the register values according to the value of the context index D43 until "High" state of the slice head signal D15 is detected.

In this way, the control unit 105 has a 460-bit register and changes the value of each bit of the 460-bit register according to the value of the context index D43. Consequently the control unit 105 can determine whether or not a given type of context index is input for the first time since "High" state of the slice head signal D15 was detected.

Figure 3B:
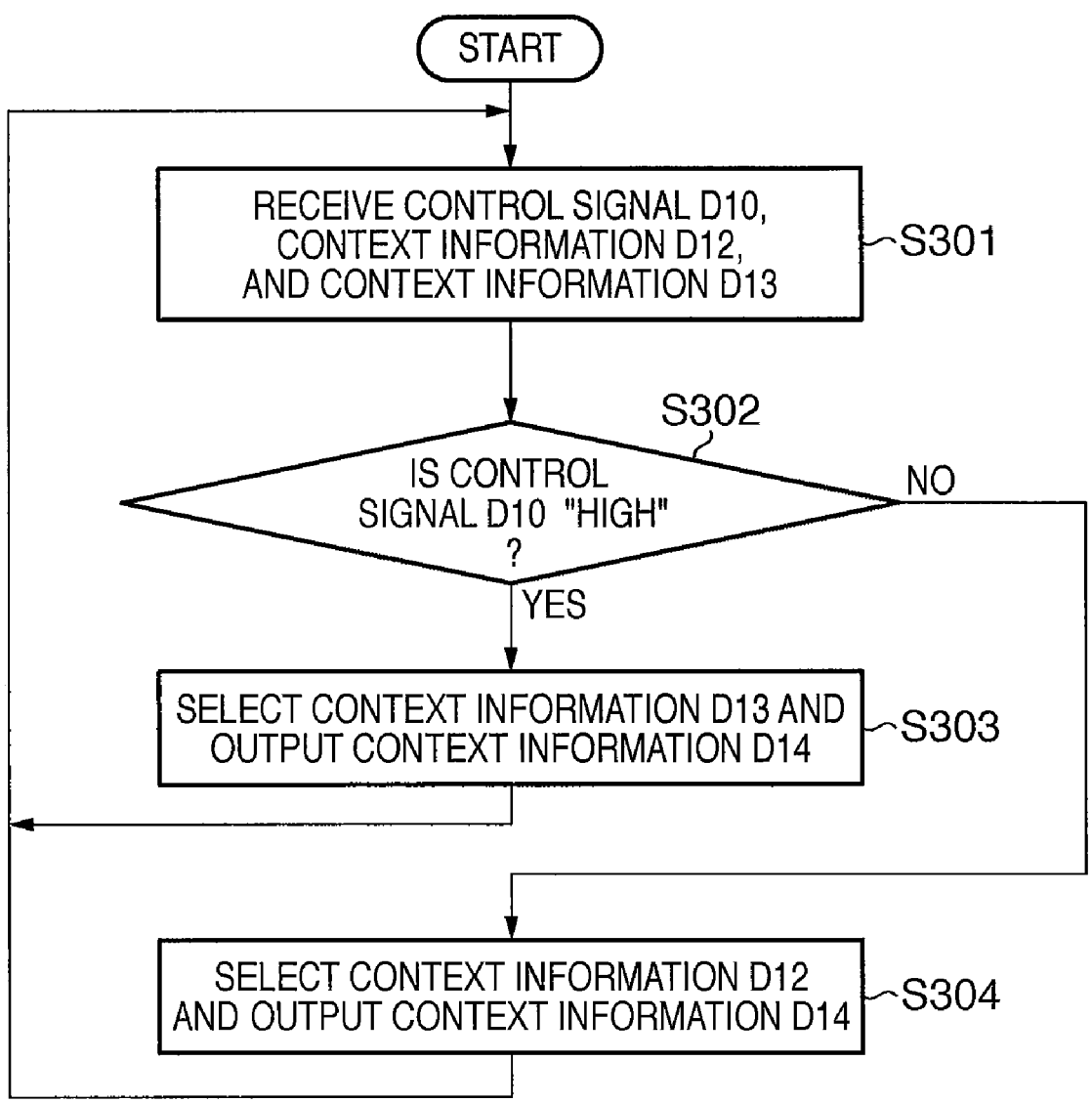
FIG. 3B is a flowchart showing an example of a process performed by the selection unit 103 according to the embodiment of the present invention.

Next, a context information selection process performed by the selection unit 103 will be described with reference to FIGS. 3A and 3B. FIG. 3A is a timing chart showing an example of a process in the selection unit 103. FIG. 3B is a flowchart showing an example of a process performed by the selection unit 103.

The clock 201 in FIG. 3A is an operation clock used by the context memory unit 100.

The context index D43 is a signal input in the context memory unit 100 from the context calculation unit 402. Symbols B, C, D, E, F, G, H, and I assigned to each signal represent types of the context index D43. In FIG. 3A, although hidden, symbol A actually exists ahead of symbol B.

The control signal D10 is output from the control unit 105 to the selection unit 103. The context information D12 is output from the memory 101. Symbols A', B', C', D', E', F', G', and H' represent types of context information and correspond to A, B, C, D, E, F, G, and H of the context index D43, respectively.

Context information D13 represents the initial value of the context information output from the initial value generation unit 102. The context index D43 is input in the initial value generation unit 102, which constantly outputs initialized context information D13 corresponding to the input context index D43. Symbols a', b', c', d', e', f', g', and h' in FIG. 3A represent types of context information and correspond to A, B, C, D, E, F, G, and H of the context index D43.

Context information D14 represents output from the selection unit 103. When the control signal D10 is "Low", the selection unit 103 selects and outputs the context information D12. When the control signal D10 is "High", the selection unit 103 selects and outputs the context information D13.

Operations of the selection unit 103 will be described in more detail below with additional reference to the flowchart in FIG. 3B.

In Step S301, the selection unit 103 receives the control signal D10 from the control unit 105, context information D12 from the memory 101, and context information D13 from the initial value generation unit 102. Incidentally, in FIG. 3A, the control signal D10 is received one clock pulse earlier than each context information, but signal timing is left up to design and the description of the flowchart in FIG. 3B does not go into precise timing.

In the following Step S302, the selection unit 103 determines whether or not the received control signal D10 is "High". If the control signal D10 is "High" ("YES" in Step S302), the selection unit 103 goes to Step S303. The "High" state of the control signal D10 means that a slice head signal D15 has been input in the control unit 105 and that the context information needs to be initialized. Thus, in Step S303, the selection unit 103 selects context information D13 received from the initial value generation unit 102.

In the example of FIG. 3A, the context indices D43 of D, F, and G represent the context information which needs to be initialized. The control signal D10 goes "High" when any of the context indices D, F, and G is input. Thus, the selection unit 103 selects the context information D13 and outputs the context information D14.

On the other hand, when the received control signal D10 is "Low" ("NO" in Step S302), the selection unit 103 goes to Step S304. The "Low" state of the control signal D10 means that the context information does not need to be initialized. Thus, in Step S304, the selection unit 103 selects context information D12 received from the memory 101.

In the example of FIG. 3A, the context indices D43 of A, B, C, E, and H represent the context information which does not need to be initialized. The control signal D10 goes "Low" when any of the context indices A, B, C, E, and H is input. Thus, the selection unit 103 selects the context information D12 and outputs the context information D14.

In this way, according to the present embodiment, a register is provided in the control unit 105 and one of an initial value and stored value is selected and output based on whether the given type of context index has already been received for the first time since the slice head. This eliminates the need to initialize the memory 101 all at once with the initial values of the context information, and all that is necessary is to reset the register. Also, initial values are sequentially written into the memory 101 according to the value of the input context index D43. This reduces the processing time required to generate initialized context information.

Executing the processes described above reduces the amount of processing cycles required to initialize context information and thereby speeds up the initialization of context information. This allows the processing time required for an arithmetic coding process to be reduced.

Other Exemplary Embodiments

The above-described exemplary embodiments of the present invention can also be achieved by providing a computer-readable storage medium that stores program code of software (computer program) which realizes the operations of the above-described exemplary embodiments, to a system or an apparatus. Further, the above-described exemplary embodiments can be achieved by program code (computer program) stored in a storage medium read and executed by a computer (CPU or micro-processing unit (MPU)) of a system or an apparatus.

The computer program realizes each step included in the flowcharts of the above-mentioned exemplary embodiments. Namely, the computer program is a program that corresponds to each processing unit of each step included in the flowcharts for causing a computer to function. In this case, the computer program itself read from a computer-readable storage medium realizes the operations of the above-described exemplary embodiments, and the storage medium storing the computer program constitutes the present invention.

Further, the storage medium which provides the computer program can be, for example, a floppy disk, a hard disk, a magnetic storage medium such as a magnetic tape, an optical/magneto-optical storage medium such as a magneto-optical disk (MO), a compact disc (CD), a digital versatile disc (DVD), a CD read-only memory (CD-ROM), a CD recordable (CD-R), a nonvolatile semiconductor memory, a ROM and so on.

Further, an OS or the like working on a computer can also perform a part or the whole of processes according to instructions of the computer program and realize functions of the above-described exemplary embodiments.

In the above-described exemplary embodiments, the CPU jointly executes each step in the flowchart with a memory, hard disk, a display device and so on. However, the present invention is not limited to the above configuration, and a dedicated electronic circuit can perform a part or the whole of processes in each step described in each flowchart in place of the CPU.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-250066, filed on Sep. 26, 2007, which is hereby incorporated by reference herein in its entirety.

What is claimed is:

1. An entropy encoding apparatus comprising:
 a binarization unit configured to convert an input syntax element into binarized data;
 a context calculation unit configured to generate a context index used to identify context information for each bit of the binarized data;
 a context memory unit configured to hold context information; and
 an arithmetic coding unit configured to perform arithmetic coding using context information output from said context memory unit corresponding to the generated context index, and the binarized data,
 wherein said context memory unit comprises:
  a storage unit configured to hold context information,
  an initial value generation unit configured to generate an initial value of context information based on the generated context index,
  a control unit configured to output a control signal specifying which to select between the initial value and the context information which, being held in said storage unit, corresponds to the generated context index,
  a selection unit configured to select either of the initial value or the context information which corresponds to the generated context index, based on the control signal, and output selected context information which contains most probable symbol and probability state index,
  an updating unit configured to receive the selected context information and the binarized data, compare a value of the binarized data and a value of the most probable symbol contained in the selected context information, and generate updated context information based on a comparison result between the compared two values,
 wherein when the compared two values are not equal, said updating unit generates the updated context information in which a value of the probability state index contained in the selected context information is updated according to a predetermined table, and output the updated context information to said arithmetic coding unit and said storage unit so that said storage unit holds the updated context information associating with the generated context index.

2. The apparatus according to claim 1, wherein said control unit:
 comprises a register with a bit count corresponding to the number of types of the context index, and outputs the control signal according to a value of a bit position of the register, the bit position corresponding to the type of the generated context index.

3. The apparatus according to claim 2, wherein said control unit:

further comprises a receiving unit configured to receive the generated context index and a signal which indicates whether or not the context index corresponds to a slice head; and resets the register and asserts a bit position in the resister corresponding to a type of context index received after the reset when the slice head is detected based on the received signal.

4. A computer program stored in a computer-readable storage medium for making a computer function as an entropy encoding apparatus according to claim 1.

5. An entropy encoding method for an entropy encoding apparatus comprising:

converting an input syntax element into binarized data using a binarization unit;

generating a context index used to identify context information for each bit of the binarized data using a context calculation unit;

outputting context information corresponding to the generated context index using a content memory unit; and performing arithmetic coding with the output context information and the binarized data using an arithmetic coding unit, wherein said context memory unit comprises a storage unit configured to hold context information, an initial value generation unit, a control unit, a selection unit, and an updating unit, and said outputting comprises:

generating an initial value of context information based on the generated context index using the initial value generation unit, outputting a control signal specifying which to select between the initial value and the context information which, being held in said storage unit, corresponds to the generated context index, selecting either of the initial value or the context information which corresponds to the generated context index, based on the control signal using the selection unit, outputting selected context information which contains most probable symbol and probability state index, using the selecting unit, receiving the selected context information and the binarized data, using the updating unit, comparing a value of the binarized data and a value of the most probable symbol contained in the selected context information, using the updating unit, and generating updated context information based on a comparison result between the compared two values, wherein when the compared two values are not equal, the updated context information in which a value of the probability state index contained in the selected context information is updated according to a predetermined table is generated and output to said arithmetic coding unit and said storage unit using said updating unit, so that the updated context information is held in said storage unit, associating with the generated context index using the storage unit.

6. The method according to claim 5, wherein:

said control unit comprises a register with a bit count corresponding to the number of types of the context index, and at said outputting context information, the control signal is output according to a value of a bit position of the register, the bit position corresponding to the type of the generated context index.

7. The method according to claim 6, wherein:

said control unit further comprises a receiving unit configured to receive the generated context index and a signal which indicates whether or not the context index corresponds to a slice head; and at said control outputting a control signal, the register is reset and a bit position in the resister corresponding to a type of context index received after the reset is asserted when the slice head is detected based on the received signal.

* * * * *